US012787179B2

(12) United States Patent

Takahashi et al.

(10) Patent No.: US 12,787,179 B2

(45) Date of Patent: Nov. 3, 2026

(54) METHOD FOR MANUFACTURING WIRING SUBSTRATE

(71) Applicant: IBIDEN CO., LTD., Ogaki (JP)

(72) Inventors: Michimasa Takahashi, Ogaki (JP); Hideyuki Goto, Ogaki (JP); Kiyohiro Ishikawa, Ogaki (JP); Ayami Ohno, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 847 days.

(21) Appl. No.: 17/822,265

(22) Filed: Aug. 25, 2022

(65) Prior Publication Data

US 2023/0063719 A1 Mar. 2, 2023

(30) Foreign Application Priority Data

Aug. 31, 2021 (JP) ................................ 2021-141393

(51) Int. Cl.

*H05K 3/00* (2006.01)
*H05K 1/11* (2006.01)
(Continued)

(52) U.S. Cl.

CPC ........... *H05K 3/0094* (2013.01); *H05K 1/115* (2013.01); *H05K 3/0038* (2013.01); *H05K 3/027* (2013.01);
(Continued)

(58) Field of Classification Search

CPC .... H05K 3/0094; H05K 3/0038; H05K 3/048; H05K 3/108; H05K 3/427; H05K 3/027;
(Continued)

(56) References Cited

U.S. PATENT DOCUMENTS 4,791,248 A * 12/1988 Oldenettel ........... H05K 3/0094 174/265
5,460,680 A * 10/1995 Yamaguchi .... H05K 2201/0129 156/289
8,018,045 B2 * 9/2011 En ......................... H05K 3/108 438/622

FOREIGN PATENT DOCUMENTS

JP 2001-298257 A 10/2001
JP 2009021274 A * 1/2009

OTHER PUBLICATIONS

W. Engelmaier, "Thermal Characteristics of Multilayer Printed Wiring Boards During Lamination," in IEEE Transactions on Electrical Insulation, vol. EI-10, No. 3, pp. 98-101, Sep. 1975. (Year: 1975).*

* cited by examiner

*Primary Examiner* — A. Dexter Tugbang

(74) *Attorney, Agent, or Firm* — Finnegan, Henderson Farabow, Garrett & Dunner, LLP

(57) ABSTRACT

A method for manufacturing a wiring substrate includes preparing a substrate including an insulating layer and metal foils, forming a through hole in the substrate to penetrate through the insulating layer and foils, forming a first plating film on the substrate such that the first film is formed on the entire surface of each metal foil and the inner wall of the hole, laminating one or more resin sheets on the first film such that the resin sheet or sheets cover the first film on the entire surface of a respective one of the foils, pressing the resin sheet or sheets such that resin is extruded from the resin sheet or sheets into the hole and fills space surrounded by the first film inside the hole, removing the resin sheet or sheets, and forming a second plating film on the substrate to cover surface of the resin in the hole.

20 Claims, 8 Drawing Sheets

(51) Int. Cl.
*H05K 3/02* (2006.01)
*H05K 3/04* (2006.01)
*H05K 3/10* (2006.01)
*H05K 3/26* (2006.01)
*H05K 3/42* (2006.01)

(52) U.S. Cl.
CPC ............... *H05K 3/048* (2013.01); *H05K 3/26* (2013.01); *H05K 3/108* (2013.01); *H05K 3/427* (2013.01); *H05K 2201/09481* (2013.01); *H05K 2201/0959* (2013.01); *H05K 2201/096* (2013.01); *H05K 2203/068* (2013.01); *H05K 2203/072* (2013.01); *H05K 2203/0723* (2013.01); *H05K 2203/107* (2013.01)

(58) Field of Classification Search
CPC ............... H05K 3/26; H05K 2203/068; H05K 2203/072; H05K 2203/0723; H05K 2201/0129; H05K 2201/09481; H05K 2201/0959; H05K 2201/096
See application file for complete search history.

METHOD FOR MANUFACTURING WIRING SUBSTRATE

CROSS-REFERENCE TO RELATED APPLICATIONS

The present application is based upon and claims the benefit of priority to Japanese Patent Application No. 2021-141393, filed Aug. 31, 2021, the entire contents of which are incorporated herein by reference.

BACKGROUND OF THE INVENTION

Field of the Invention

The present invention relates to a method for manufacturing a wiring substrate.

Description of Background Art

Japanese Patent Application Laid-Open Publication No. 2001-298257 describes a method for manufacturing a printed wiring board in which a hole-filling paste is filled and cured in through holes of a substrate having the through holes. The entire contents of this publication are incorporated herein by reference.

SUMMARY OF THE INVENTION

According to one aspect of the present invention, a method for manufacturing a wiring substrate includes preparing a substrate including an insulating layer and metal foils laminated on sides of the insulating layer, respectively, forming a through hole in the substrate such that the through hole penetrates through the insulating layer and metal foils of the substrate, forming a first plating film on the substrate such that the first plating film is formed on the entire surface of each of the metal foils and an inner wall of the through hole, laminating one or more resin sheets on the first plating film such that the resin sheet or sheets cover the first plating film formed on the entire surface of a respective one of the metal foils, pressing the resin sheet or sheets such that resin is extruded from the resin sheet or sheets into the through hole and fills a space surrounded by the first plating film inside the through hole in the substrate, removing the resin sheet or sheets from the first plating film formed on the respective one of the metal foils, and forming a second plating film on the substrate such that the second plating film covers a surface of the resin in the through hole.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
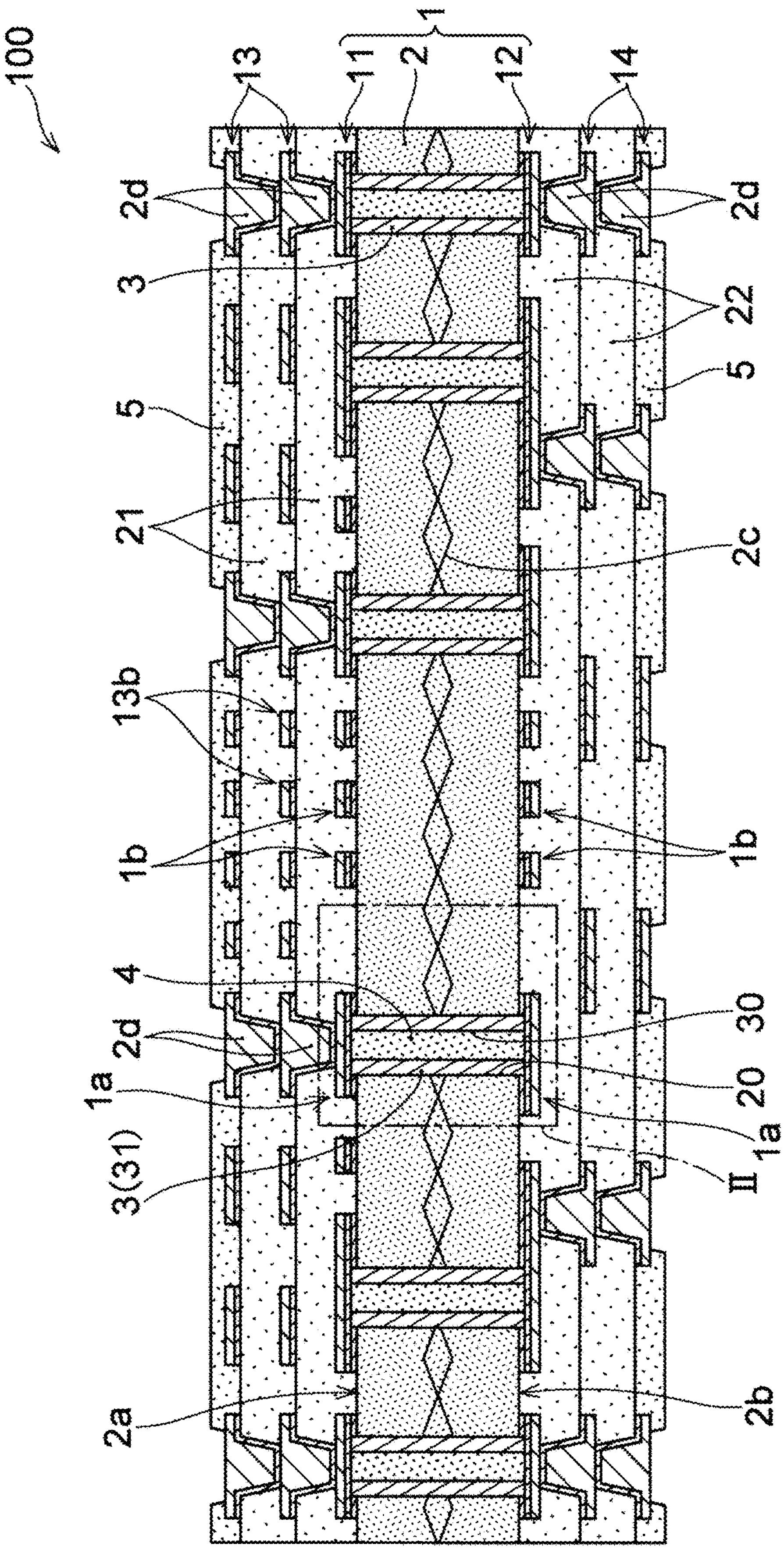
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
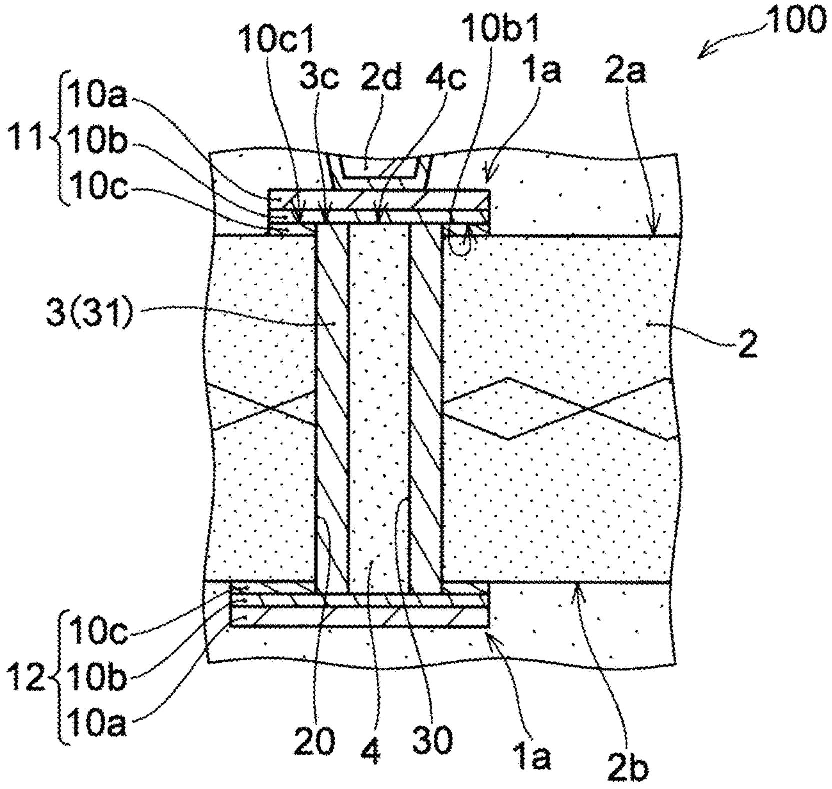
FIG. 2 is an enlarged view of a portion (II) of FIG. 1.
Figure 3A:
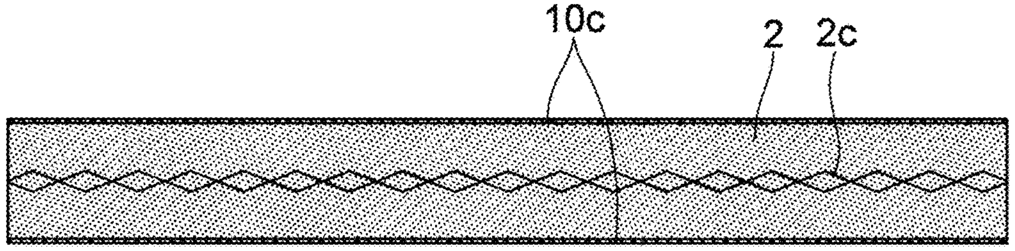
FIG. 3A is a cross-sectional view illustrating an example of a wiring substrate being manufactured using a manufacturing method according to an embodiment of the present invention.

A method for manufacturing a wiring substrate according to an embodiment of the present invention is described with reference to the drawings. FIG. 1 is a cross-sectional view illustrating a wiring substrate 100, which is an example of a wiring substrate manufactured using the method for manufacturing a wiring substrate of the embodiment, and FIG. 2 is an enlarged view of a portion (II) of FIG. 1. FIGS. 3A-3N illustrate an example of a method for manufacturing the wiring substrate 100. The wiring substrate 100 is merely an example of a wiring substrate that may be manufactured using a method for manufacturing a wiring substrate according to an embodiment of the present invention. A laminated structure and the number of conductor layers and the number of insulating layers of a wiring substrate manufactured using the method for manufacturing a wiring substrate of the present embodiment are not limited to a laminated structure of the wiring substrate 100 of FIG. 1, and the number of conductor layers and the number of insulating layers included in the wiring substrate 100.

As illustrated in FIGS. 1 and 2, the wiring substrate 100 includes an insulating layer 2 and two conductor layers (conductor layer 11 and conductor layer 12) that are respectively formed on both sides of the insulating layer 2. A core substrate 1 of the wiring substrate 100 is formed by the insulating layer 2, the conductor layer 11, and the conductor layer 12. The insulating layer 2 has a first surface (2*a*) and a second surface (2*b*) on the opposite side with respect to the first surface (2*a*), and further has through holes 20 that each penetrate the insulating layer 2 in a thickness direction between the first surface (2*a*) and second surface (2*b*). The conductor layer 11 is formed on the first surface (2*a*) of the insulating layer 2, and the conductor layer 12 is formed on the second surface (2*b*) of the insulating layer 2. On the first surface (2*a*) of the insulating layer 2 and on the conductor layer 11, two insulating layers 21 and two conductor layers 13 are alternately laminated, and on the second surface (2*b*) of the insulating layer 2 and on the conductor layer 12, two insulating layers 22 and two conductor layers 14 are alternately laminated. The two pairs of insulating layers 21 and conductor layers 13 and the two pairs of insulating layers 22 and conductor layers 14 respectively form build-up parts of the wiring substrate 100 on the first surface (2*a*) side and the second surface (2*b*) side of the insulating layer 2.

In the description of the embodiment, a side farther from the insulating layer 2 in a thickness direction of the wiring substrate 100 is also referred to as an "outer side," an "upper side," or simply "upper," and a side closer to the insulating layer 2 is also referred to as an "inner side," a "lower side," or simply "lower." Further, for the conductor layers and the insulating layers, a surface facing the opposite side with respect to the insulating layer 2 is also referred to as an "upper surface," and a surface facing the insulating layer 2 side is also referred to as a "lower surface."

A solder resist 5 is formed on the outer conductor layer 13 and insulating layer 21 of the two pairs of conductor layers 13 and insulating layers 21. Similarly, a solder resist 5 is formed on the outer conductor layer 14 and insulating layer 22 of the two pairs of conductor layers 14 and insulating layers 22. Each of the solder resists 5 is provided with openings that each expose a part of the conductor layer 13 or a part of the conductor layer 14. Each of the solder resists 5 is formed of, for example, a photosensitive epoxy resin or polyimide resin, or the like.

In each of the insulating layers 21 and the insulating layers 22, via conductors (2*d*) penetrating the each insulating layer are formed. The via conductors (2*d*) penetrating the insulating layers 21 connect the conductor layers 13 to each other or the conductor layer 13 and the conductor layer 11. The via conductors (2*d*) penetrating the insulating layers 22 connect the conductor layers 14 to each other or the conductor layer 14 and the conductor layer 12.

The wiring substrate 100 further includes through-hole conductors 3 that physically and electrically connect the conductor layer 11 and the conductor layer 12 to each other. The through-hole conductors 3 are formed in the through holes 20 of the insulating layer 2. The wiring substrate 100 of FIG. 1 includes multiple through-hole conductors 3. The via conductors (2*d*) are laminated directly above some of the through-hole conductors 3. Penetrating conductors penetrating from one surface to the other surface of the wiring substrate 100 are formed by the through-hole conductors 3 and the multiple via conductors (2*d*) laminated overlapping the through-hole conductors 3 in a plan view. The term "plan view" means viewing the wiring substrate of the embodiment along the thickness direction thereof.

The through-hole conductors 3 cover inner walls of the through holes 20 along the inner walls, and have a predetermined thickness on the inner walls of the through holes 20 without completely filling the through holes 20. That is, the through-hole conductors 3 have hollow spaces 30 penetrating the through-hole conductors 3 in the thickness direction of the insulating layer 2, and as a whole have tubular shapes along the inner walls of the through holes 20. The hollow spaces 30 are also regions in the through holes 20 that are not occupied by a film body (first plating film 31) that forms the through-hole conductors 3.

The wiring substrate 100 further includes a resin 4 filling the hollow spaces 30. The hollow spaces 30 are preferably substantially completely filled with the resin 4. The hollow spaces 30 are filled with the resin 4 and, as will be described later, a surface (4*c*) of the resin 4 is flat. Therefore, as in the example of FIGS. 1 and 2, the via conductors (2*d*) are stably formed directly above the through holes 20. Further, it may be possible that, as compared to a case where the entire interiors of the through holes 20 are filled with the through-hole conductors 3, the interiors of the through holes 20 are filled in a short time. Further, it may be possible that, by selecting a resin having a thermal expansion coefficient close to that of the insulating layer 2 as the resin 4, a thermal stress generated in the insulating layer 2 is reduced. However, the resin 4 is not particularly limited in material as long as the resin 4 fills the hollow spaces 30. The resin 4 may be non-conductive or conductive. The resin 4 may be, for example, an insulating resin such as an epoxy resin, an acrylic resin, or a phenol resin, a conductive paste or conductive ink containing conductive particles such as silver particles, an epoxy resin and the like, or a magnetic resin containing an epoxy resin and magnetic particles. The magnetic particles may be iron oxide filler such as FeO, $Fe_2O_3$, and $Fe_3O_4$.

The insulating layer 2 and the insulating layers (21, 22) are formed of any insulating resin. An example of the insulating resin is a thermosetting resin such as an epoxy resin, a bismaleimide triazine resin (BT resin), or a phenol resin. In the example of FIG. 1, the insulating layer 2 contains a core material (reinforcing material) (2*c*) formed of a glass fiber, an aramid fiber, or the like. Each of the insulating layers may further contain inorganic filler (not illustrated in the drawings) formed of fine particles of silica (SiO2), alumina, mullite, or the like.

The conductor layers (11-14), as well as the through-hole conductors 3 and the via conductors (2*d*), may be formed using any metal such as copper or nickel. Each of the conductor layers (13, 14) and the via conductor (2*d*) has a two-layer structure in the example of FIG. 1 but may have a single-layer structure or a laminated structure with any number of layers. Each of the conductor layers (13, 14) and the via conductors (2*d*) of FIG. 1 includes, for example, a metal film formed by electroless plating or sputtering or the like and a plating film formed by electrolytic plating using the metal film as a power feeding layer. Each of the via conductors (2*d*) is integrally formed with one of the conductor layers 13 and the conductor layers 14.

In the example of FIGS. 1 and 2, the through-hole conductors 3 are formed by the first plating film 31 on the inner walls of the through holes 20 so as to cover the inner walls. That is, the first plating film 31 is formed in a tubular shape with the thickness direction of the insulating layer 2 as an axial direction thereof. The first plating film 31 is, for example, a plating film formed of an electroless plating film and electrolytic plating film, the electroless plating film being formed on the inner walls of the through holes 20, and the electrolytic plating film being formed using the electroless plating film as a power feeding layer and being formed on an inner side of the electroless plating film in the through holes 20 so as to cover the electroless plating film. However, the through-hole conductors 3 may be formed of a plating film with any number of layers equal to or larger than one. In FIGS. 1 and 2, the first plating film 31 is illustrated as a single-layer plating film.

In the present embodiment, each of the conductor layer 11 and the conductor layer 12 has a laminated structure with three or less layers. In the wiring substrate 100 of FIGS. 1 and 2, the lamination structure of each of the conductor layer 11 and the conductor layer 12 is a three-layer structure. As illustrated in the enlarged view of FIG. 2, this three-layer structure includes a metal foil (10*c*), a metal film (second plating film) (10*b*), and a metal film (10*a*). These metal foil (10*c*), metal film (10*b*), and metal film (10*a*) are laminated on each of the first surface (2*a*) and the second surface (2*b*) of the insulating layer 2 in the order of the metal foil (10*c*), the metal film (10*b*), and the metal film (10*a*). However, instead of a three-layer structure, each of the conductor layer 11 and the conductor layer 12 may have, for example, a two-layer structure formed of a metal foil (10*c*) and a thick metal film (10*b*) formed on the metal foil (10*c*).

The metal foil (10*c*) may be formed of any metal, and is, for example, a foil body such as a copper foil or a nickel foil. The metal foil (10*c*) is, for example, a copper foil bonded to the insulating layer 2 by thermocompression. The metal film (10*b*) is formed, for example, using any metal such as copper or nickel. The metal film (10*b*) is, for example, an electroless plating film formed by electroless plating. It is also possible that the metal film (10*b*) is a metal film formed by sputtering. The metal film (10*a*) is formed, for example, using any metal such as copper or nickel. The metal film (10*a*) is, for example, an electrolytic plating film formed by electrolytic plating using the metal film (10*b*) and the metal foil (10*c*) as power feeding layers.

Each of the conductor layers (11-14) may include any conductor patterns. In the example of FIG. 1, the conductor layer 11 and the conductor layer 12 include conductor pads (1*a*) and multiple wiring patterns (1*b*). The conductor pads (1*a*) are provided at positions overlapping the through-hole conductors 3 in a plan view. That is, the conductor pads (1*a*) function as so-called through-hole pads of the through-hole conductors 3. The conductor pads (1*a*) are also provided at positions overlapping the through holes 20 and the hollow spaces 30 in a plan view. The conductor pads (1*a*) close the through holes 20 and the hollow spaces 30. Therefore, the conductor pads (1*a*) are also so-called cover pads of the through-hole conductors 3. The through holes 20 and the hollow spaces 30 are sandwiched between the conductor pads (1*a*) of the conductor layer 11 and the conductor pads (1*a*) of the conductor layer 12. Since the conductor pads (1*a*), which are cover pads, are provided, the via conductors (2*d*) is provided directly above the through-hole conductors 3. It is thought that miniaturization of the wiring substrate is realized. It is thought that the via conductors (2*d*) and the through-hole conductors 3 are stably and firmly electrically connected.

With reference to FIG. 2, as described above, the conductor pad (1*a*) is formed of three layers including the metal foil (10*c*), the metal film (10*b*) and the metal film (10*a*), and the through hole 20 and the hollow space 30 are closed on both the first surface (2*a*) side and the second surface (2*b*) side of the insulating layer 2. Therefore, the conductor pad (1*a*) included in each of the conductor layer 11 and the conductor layer 12 is in direct contact with the through-hole conductor 3. In the example of FIG. 2, the through-hole conductor 3 is connected to the metal film (10*b*) such that an end surface (3*c*) of the through-hole conductor 3 is in contact with a surface (10*b*1) of the metal film (10*b*) on the opposite side with respect to the metal film (10*a*).

The through-hole conductor 3 and the conductor pad (1*a*) are not integrally formed. There is an interface between the through-hole conductor 3 and the conductor pad (1*a*). The first plating film 31 that forms the through-hole conductor 3 is not integrally formed with any one of the metal film (10*a*), the metal film (10*b*) and the metal foil (10*c*). Since the first plating film 31 is formed before the metal film (10*b*) as to be described later, there is an interface between the first plating film 31 and the metal film (10*b*).

The through-hole conductor 3 (first plating film 31) formed in a tubular shape penetrates not only the insulating layer 2 but also the metal foil (10*c*). As illustrated in FIG. 2, the end surface (3*c*) of the first plating film 31 in a tubular shape and the surface (4*c*) of the resin 4 filling the hollow space 30 are in contact with the surface (10*b*1) of the metal film (10*b*). In the present embodiment, the surface (4*c*) of the resin 4 is formed substantially parallel to the first surface (2*a*) and the second surface (2*b*) of the insulating layer 2. The end surface (3*c*) of the first plating film 31 in a tubular shape and the surface (4*c*) of the resin 4 are formed substantially flush with each other. An interface between a through-hole surface, which is formed by the end surface (3*c*) of the through-hole conductor 3 and the surface (4*c*) of the resin 4, and the conductor pad (1*a*) is highly flat. In the present embodiment, since the through-hole surface is maintained highly flat, the via conductor (2*d*) is laminated on the through hole via the conductor pad (1*a*). It is thought that a mounting density of the wiring substrates is increased.

In the present embodiment, further, the through-hole surface, which is formed of the end surface (3*c*) of the through-hole conductor 3 and the surface (4*c*) of the resin 4, is formed at a substantially constant height from the first surface (2*a*) of the insulating layer 2. There is no recess on the through-hole surface. As illustrated in FIG. 2, the through-hole surface is formed substantially flush with a surface (10*c*1) of the metal foil (10*c*) facing the metal film (10*b*). The metal film (10*b*) and the metal film (10*a*) are formed on the through-hole surface and the surface (10*c*1) of the metal foil (10*c*). Therefore, the metal film (10*b*) and the metal film (10*a*) are also formed with a high flatness and at a substantially constant height from the first surface (2*a*) of the insulating layer 2. It is thought that, since occurrence of a recess in the conductor pad (1*a*) is suppressed, bonding between the conductor pad (1*a*) and the via conductor (2*d*) formed thereon is stabilized. Bonding reliability between the through hole and a conductor circuit formed thereon is improved, and a wiring substrate 100 with a high connection reliability is obtained.

The end surface (3*c*) of the through-hole conductor 3, the surface (4*c*) of the resin 4, and the surface (10*c*1) of the metal foil (10*c*) are formed substantially flush with each other. However, in order to further improve the flatness of the surfaces, a surface formed of the end surface (3*c*), the surface (4*c*), and the surface (10*c*1) may be a processed surface that has been subjected to processing. For example, mechanical processing such as cutting or polishing may be performed with respect to the surface. Therefore, the end surface (3*c*), the surface (4*c*), and the surface (10*c*1) may be polished surfaces that have been subjected to a polishing treatment.

Using the wiring substrate 100 illustrated in FIGS. 1 and 2 as an example, a method for manufacturing the wiring substrate of the embodiment is described with reference to FIGS. 3A-3N. Structural elements formed in the manufacturing method to be described below may be formed using the materials exemplified as the materials of the corresponding structural elements in the description of the wiring substrate 100 in FIG. 1, unless otherwise specified.

As illustrated in FIG. 3A, a substrate (starting substrate) including an insulating layer 2 and a metal foil (10*c*) laminated on both sides of the insulating layer 2 is prepared. The insulating layer 2 is formed of, for example, any insulating resin such as epoxy resin, a BT resin, or a phenol resin. The insulating layer 2 contains a core material (2*c*). However, it is also possible that the insulating layer 2 does not contain the core material (2*c*). The metal foil (10*c*) is formed of, for example, any metal such as copper or nickel. The metal foil (10*c*) is bonded to both sides of the insulating layer 2 using any method such as thermocompression bonding. For example, a double-sided copper-clad laminated plate may be prepared as the starting substrate.

Figure 3B:
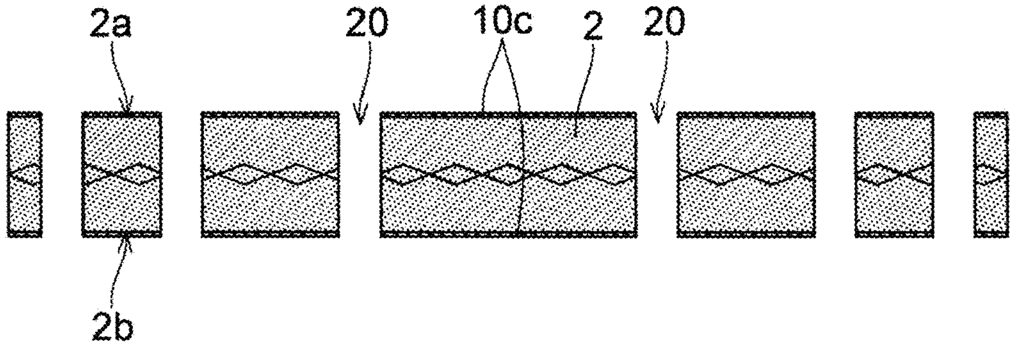
FIG. 3B is a cross-sectional view illustrating an example of a wiring substrate being manufactured using a manufacturing method according to an embodiment of the present invention.

As illustrated in FIG. 3B, through holes 20 penetrating the insulating layer 2 and the metal foil (10*c*) are formed. The through holes 20 may be formed, for example, by irradiating laser such as $CO_2$ laser from the first surface (2*a*) side and/or the second surface (2*b*) side of the insulating layer 2. It is also possible that the through holes 20 are formed by drilling. The through holes 20 may be formed using any formation method.

Figure 3C:
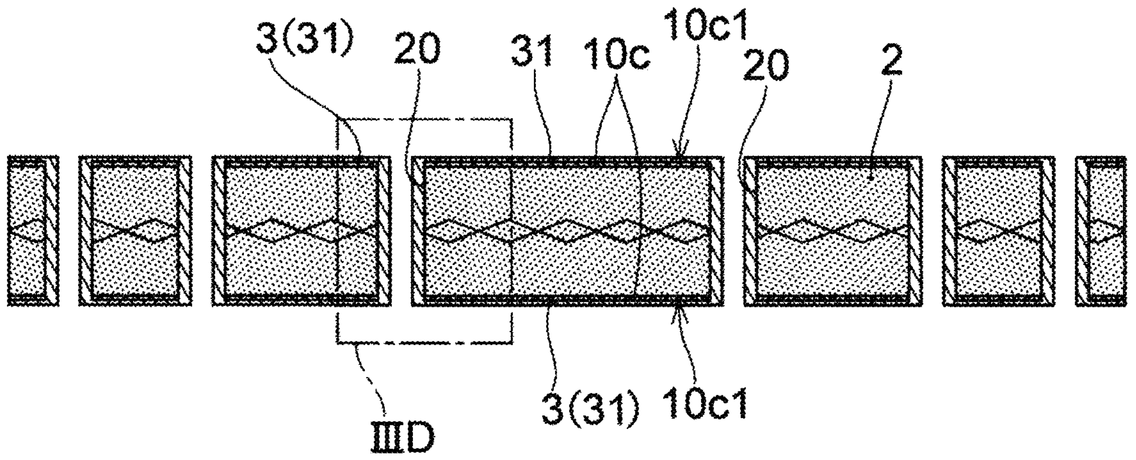
FIG. 3C is a cross-sectional view illustrating an example of a wiring substrate being manufactured using a manufacturing method according to an embodiment of the present invention.

As illustrated in FIG. 3C, a first plating film 31 is formed on an entire surface (10*c*1) of the metal foil (10*c*) on the opposite side with respect to the insulating layer 2, on exposed end surfaces of the metal foil (10*c*) facing the through holes 20, and on inner walls of the through holes 20. The first plating film 31 is formed of, for example, an electroless plating film and an electrolytic plating film. After the electroless plating film formed of any metal such as copper or nickel is formed by electroless plating, the electrolytic plating film is formed on the electroless plating film by electrolytic plating using the electroless plating film as a power feeding layer. It is also possible that, instead of the electroless plating film, a metal film such as a sputtering film formed by sputtering is formed. It is also possible that the first plating film 31 is formed of a single-layer plating film. A first plating film 31 having a desired thickness is formed. By forming the first plating film 31 on the end surfaces of the metal foil (10*c*) exposed in the through holes 20 and on the inner walls of the through holes 20, through-hole conductors 3 having hollow spaces 30 at centers thereof are formed by the first plating film 31 in the through holes 20. The metal foil (10*c*) and the first plating film 31 are sequentially laminated on each of the first surface (2*a*) and the second surface (2*b*) of the insulating layer 2.

Figure 3D:
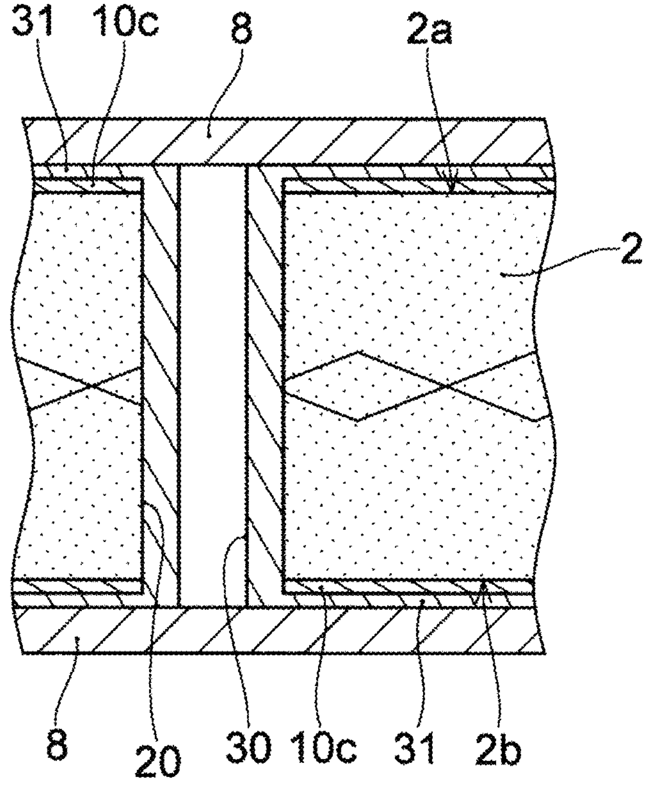
FIG. 3D is a cross-sectional view illustrating a portion of an example of a wiring substrate being manufactured using a manufacturing method according to an embodiment of the present invention.

Subsequently, a release film 8 is provided on the first plating film 31 on the surface on each of the first surface (2*a*) side and the second surface (2*b*) side of the insulating layer 2. The release film 8 is laminated on entire surfaces on both the upper side and the lower side of the wiring substrate illustrated in FIG. 3C in a process of being manufactured so as to cover the entire upper and lower surfaces. Therefore, the release film 8 also covers the hollow spaces 30. The release film 8 is not laminated inside the hollow spaces 30. A portion of the wiring substrate in a process of being manufactured in this state is illustrated in FIG. 3D. FIG. 3D is an enlarged view of only a portion corresponding to a portion (IIID) of the wiring substrate illustrated in FIG. 3C. FIGS. 3E-3L to be referenced below are also enlarged views of only the portion corresponding to the portion (IIID) of FIG. 3C in the respective processes.

As illustrated in FIG. 3D, the release film 8 is applied to the surface of the first plating film 31 on the first surface (2*a*) side and the second surface (2*b*) side of the insulating layer 2. In the manufacturing processes to be described below with reference to FIGS. 3E-3K, the same processing processes may be performed on both the first surface (2*a*) side and the second surface (2*b*) side of the insulating layer 2. Therefore, in the following description related to FIGS. 3D-3K, description related to the first surface (2*a*) side is mainly presented, and description related to the second surface (2*b*) side may be omitted. Further, in FIGS. 3D-3K, the reference numeral symbols on the second surface (2*b*) side are omitted.

The release film 8 covers the upper surface of the first plating film 31 and covers the hollow spaces 30. The release film 8 is provided using at least a material that does not firmly bond to but adheres to the first plating film 31. Therefore, the release film 8 and the first plating film 31 are easily separated from each other with a relatively weak force. For example, the release film 8 may include, for example, an adhesive layer and a bonding layer laminated on the adhesive layer. As described above, the adhesive layer is formed of a material that does not firmly bond to but sufficiently adheres to the first plating film 31. For example, an acrylic resin may be used for the adhesive layer. On the other hand, the bonding layer is formed of a material that exhibits sufficient adhesion to a resin sheet 9 (see FIG. 3F) to be described later. For example, a polyimide resin may be used for the bonding layer. When the release film 8 has such a two-layer structure, the release film 8 may be placed on the first plating film 31 such that the adhesive layer side faces the first plating film 31. However, it is also possible that the release film 8 is formed of a single layer without including the bonding layer. It is sufficient as long as the release film 8 has adhesion to the first plating film 31.

Figure 3E:
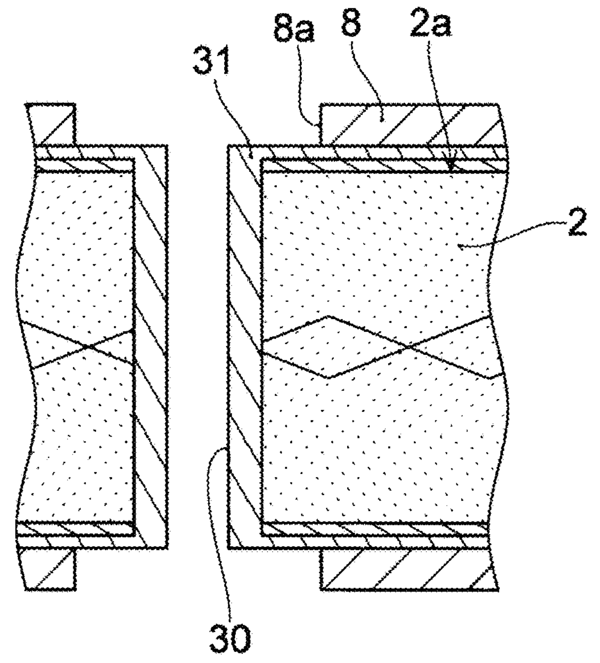
FIG. 3E is a cross-sectional view illustrating a portion of an example of a wiring substrate being manufactured using a manufacturing method according to an embodiment of the present invention.

Then, as illustrated in FIG. 3E, an opening (8*a*) is formed in the release film 8. The opening (8*a*) is formed with an area larger than an area of the hollow space 30 at a position overlapping the hollow space 30 in a plan view. Therefore, the opening (8*a*) exposes the hollow space 30 and also exposes the upper surface of the first plating film 31 at a peripheral edge part of the hollow space 30. The opening (8*a*) may be formed by laser processing. Laser is radiated from the first surface (2*a*) side of the insulating layer 2 toward the first plating film 31 at the peripheral edge part of the hollow space 30. A portion of the upper surface of the first plating film 31 and the hollow space 30 are exposed.

Figure 3F:
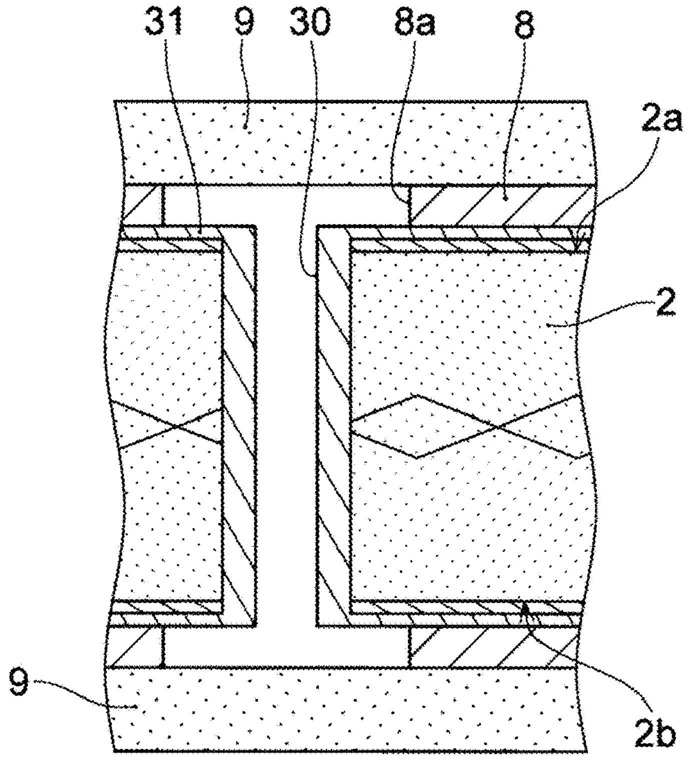
FIG. 3F is a cross-sectional view illustrating a portion of an example of a wiring substrate being manufactured using a manufacturing method according to an embodiment of the present invention.

Next, as illustrated in FIG. 3F, a resin sheet 9 is laminated on the release film 8 in which the opening (8*a*) is formed and on the entire surfaces on the first surface (2*a*) side and the second surface (2*b*) side of the insulating layer 2. That is, the resin sheet 9 covers the upper surface of the release film 8, and covers the first plating film 31 and the hollow space 30 exposed from the opening (8*a*). The resin sheet 9 is formed of a resin material that will become a resin 4 that fills the hollow space 30 after a process to be described later (see FIG. 3G). Examples of such a resin material include insulating resins such as an epoxy resin, an acrylic resin, and a phenol resin, and a magnetic resin containing an epoxy resin and magnetic particles. The magnetic particles may be iron oxide filler such as FeO, $Fe_2O_3$, and $Fe_3O_4$. For example, the resin sheet 9 is a semi-cured insulating resin sheet containing such an insulating resin material.

Figure 3G:
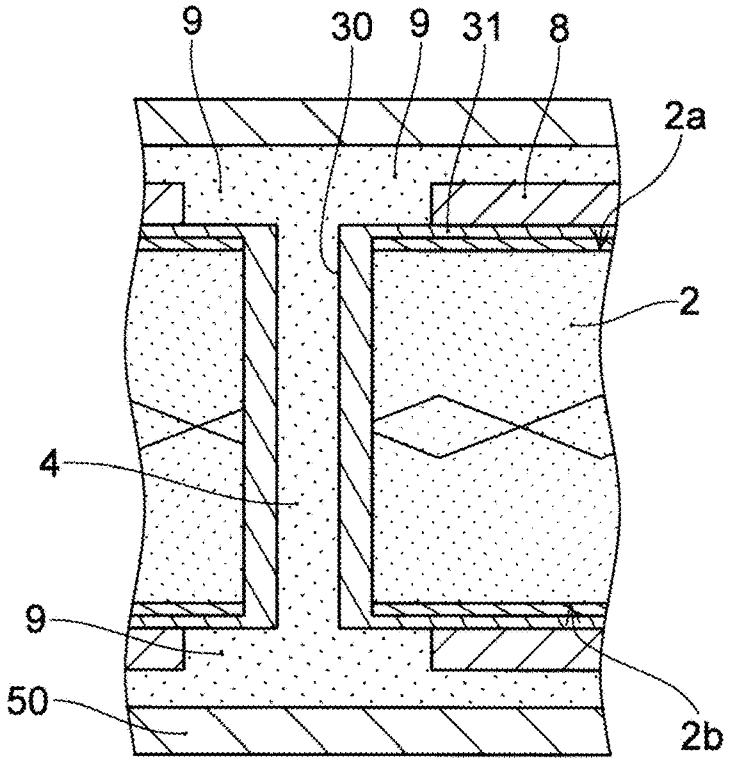
FIG. 3G is a cross-sectional view illustrating a portion of an example of a wiring substrate being manufactured using a manufacturing method according to an embodiment of the present invention.

As illustrated in FIG. 3G, by pressing the resin sheet 9 from both the first surface (2*a*) side and the second surface (2*b*) side of the insulating layer 2, the hollow space 30 is filled with the resin 4 exuded from the resin sheet 9. The pressing may be performed, for example, with heating, using a vacuum press device 50. Vacuum press conditions, that is, a temperature rising rate, a pressure, a pressure application timing, and the like, may be appropriately adjusted according to a material of the resin sheet 9 to be used. After filling the hollow space 30 with the resin 4, the resin 4 in the hollow space 30 and the resin sheet 9 on the release film 8 and on the first plating film 31 are solidified. The hollow space 30 is filled with a solidified resin material, that is, the resin 4.

By filling the hollow space 30 with a resin material using a vacuum press, even in cases such as when through holes are formed with a fine pitch, when a through hole aspect ratio (a ratio of a thickness of a core substrate to a diameter of a through hole) is large, and when through-holes with different diameters coexist, the through holes is uniformly filled with the resin material. Further, by performing the filling using a vacuum press, a volatile component that may be generated along with resin curing of the filling resin material or air that may be contained in the resin material is discharged by constant vacuuming. Therefore, there is less risk that a defect may occur such as that a void is generated in the resin 4 after filling and solidification.

Figure 3H:
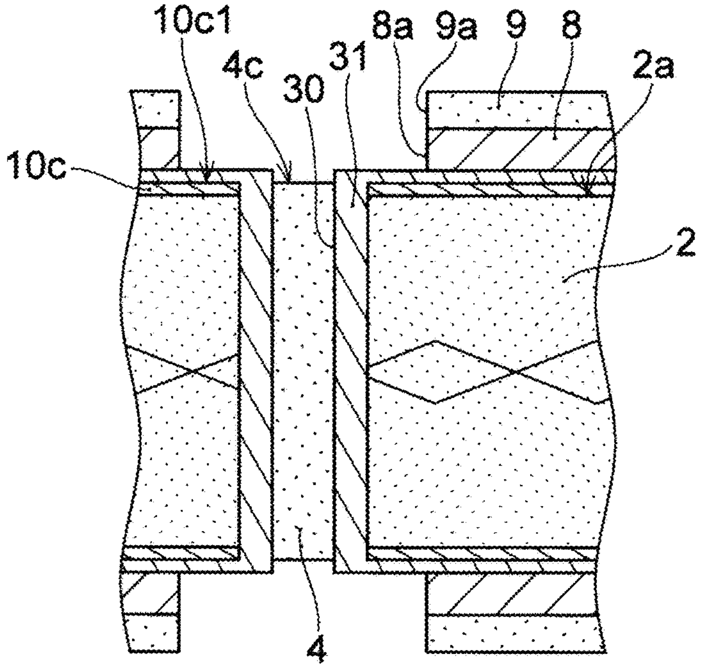
FIG. 3H is a cross-sectional view illustrating a portion of an example of a wiring substrate being manufactured using a manufacturing method according to an embodiment of the present invention.

Next, as illustrated in FIG. 3H, an opening (9*a*) is provided in the solidified resin sheet 9. The opening (9*a*) is formed by irradiating laser from the first surface (2*a*) side of the insulating layer 2 toward the first plating film 31 at the peripheral edge part of the hollow space 30. In the example of FIG. 3H, the opening (9*a*) is formed at a position that substantially overlaps the opening (8*a*) formed in the release film 8 in a plan view. However, the opening (9*a*) may be formed so as to expose an inner wall of the opening (8*a*). The solidified resin sheet 9 laminated on the first plating film 31 at the peripheral edge part of the hollow space 30 is removed from the first plating film 31 by laser irradiation. Due to the formation of the opening (9*a*), a portion of the upper surface of the first plating film 31 that was once exposed in the process illustrated in FIG. 3E is exposed again.

The present process of providing the opening (9*a*) in the resin sheet 9 further includes removing a portion of the solidified resin sheet 9 protruding from the hollow space 30 in a convex shape. Further, in the present embodiment, the removal includes removing a surface-side portion of the resin 4 filled in the hollow space 30. That is, in the present embodiment, a height of the resin 4, which is a length of the resin 4 in the hollow space 30 in the thickness direction of the insulating layer 2, is lower than a height of the upper surface of the first plating film 31 exposed by the formation of the opening (9*a*). Preferably, the removal of the surface-side portion of the resin 4 is performed until the surface (4*c*) of the resin 4 is substantially flush with the surface (10*c*1) of the metal foil (10*c*) facing the first plating film 31.

Figure 3I:
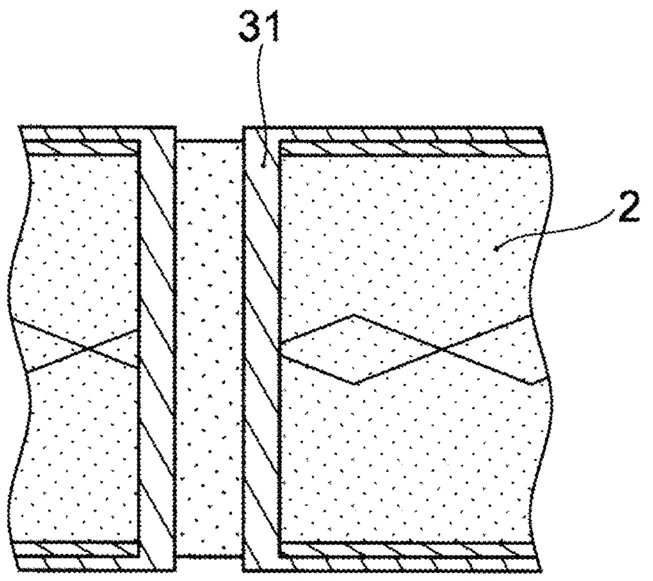
FIG. 3I is a cross-sectional view illustrating a portion of an example of a wiring substrate being manufactured using a manufacturing method according to an embodiment of the present invention.

As illustrated in FIG. 3I, the release film 8 is removed from the upper surface of the first plating film 31 together with the resin sheet 9 laminated on the release film 8. For example, the resin sheet 9 and the release film 8 may be removed by sucking a surface of a portion of the resin sheet 9 laminated on the release film 8 with a tool or the like and pulling it up to the opposite side with respect to the insulating layer 2. Since the release film 8 adheres but does not firmly bonds to the upper surface of the first plating film 31, the release film 8 and the resin sheet 9 may be simultaneously peeled off without leaving the release film 8 or residues of the release film 8 or the like on the upper surface of the first plating film 31. The entire upper surface of the first plating film 31 is exposed.

Figure 3J:
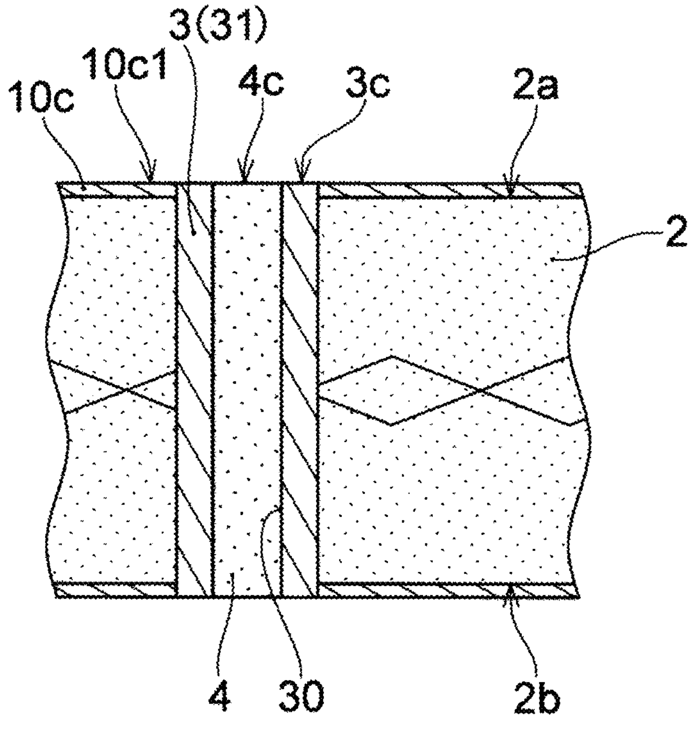
FIG. 3J is a cross-sectional view illustrating a portion of an example of a wiring substrate being manufactured using a manufacturing method according to an embodiment of the present invention.

Subsequently, as illustrated in FIG. 3J, the first plating film 31 on the surface on each of the first surface (2*a*) side and the second surface (2*b*) side of the insulating layer 2 is removed. The removal is preferably performed by etching. Through the present process, the first plating film 31 formed at a position above the height of the surface (10*c*1) of the metal foil (10*c*) laminated on the insulating layer 2 is removed over the entire surface. The surface (10*c*1) of the metal foil (10*c*) laminated on the insulating layer 2 is exposed, and the height of the end surface (3*c*) of the through-hole conductor 3 and the height of the surface (10*c*1) of the metal foil (10*c*) are substantially flush with each other.

By forming the opening (9*a*) in the resin sheet 9 illustrated in FIG. 3H, the height of the surface (4*c*) of the resin 4 inside the hollow space 30 exposed from the opening (9*a*) is substantially equal to the height of the surface (10*c*1) of the metal foil (10*c*). Therefore, as illustrated in FIG. 3J, the surface (10*c*1) of the metal foil (10*c*) on the insulating layer 2, the end surface (3*c*) of the through-hole conductor 3, and the surface (4*c*) of the resin 4 in the hollow space 30 are formed substantially flush with each other.

Optionally, after the removal of the first plating film 31 on the surfaces, the entire surfaces on both sides of the wiring substrate in a process of being manufactured may be polished. That is, the surface (10*c*1) of the metal foil (10*c*), the end surface (3*c*) of the through-hole conductor 3, and the surface (4*c*) of the resin 4 in the hollow space 30 form the surface of the wiring substrate in a process of being manufactured in which the first plating film 31 on the surfaces has been removed and are formed substantially flush with each other. The surface formed of the surface (10*c*1), the end surface (3*c*), and the surface (4*c*) are polished. The heights of the surface (10*c*1) of the metal foil (10*c*), the end surface (3*c*) of the through-hole conductor 3, and the surface (4*c*) of the resin 4 in the hollow space 30 are further satisfactorily aligned substantially flush with each other. It is thought that the flatness of the surface of the wiring substrate in a process of being manufactured including the through-hole conductor 3 filled with the resin 4 is further improved.

Examples of methods for the polishing include, but are not limited to, chemical mechanical polishing (CMP), belt sander polishing, buff polishing, and the like.

Figure 3K:
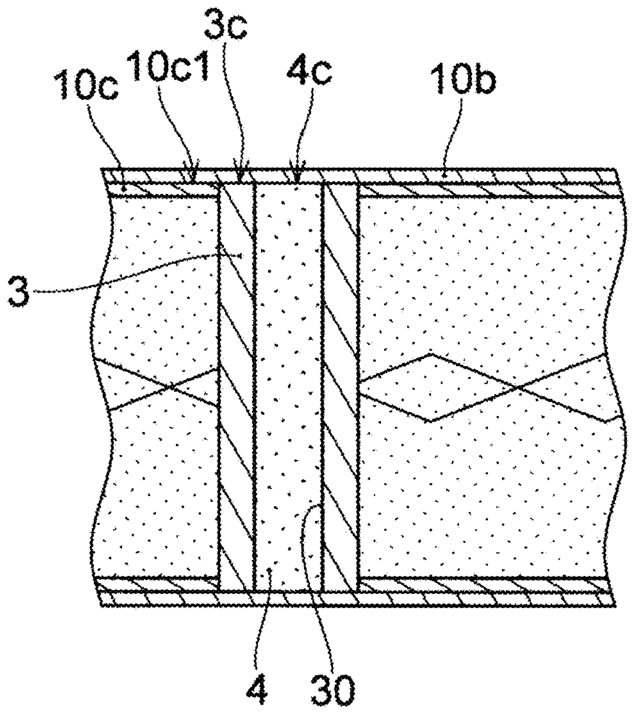
FIG. 3K is a cross-sectional view illustrating a portion of an example of a wiring substrate being manufactured using a manufacturing method according to an embodiment of the present invention.

As illustrated in FIG. 3K, a metal film (second plating film) (10*b*) is formed on the entire surface formed of the surface (10*c*1) of the metal foil (10*c*), the end surface (3*c*) of the through-hole conductor 3, and the surface (4*c*) of the resin 4 in the hollow space 30, which is the surface of the wiring substrate in a process of being manufactured in which the first plating film 31 on the surfaces has been removed. The metal film (10*b*) is an electroless plating film formed of any metal such as copper or nickel. It is also possible that the metal film (10*b*) is a sputtering film formed by sputtering. As described above, the surface (10*c*1) of the metal foil (10*c*), the end surface (3*c*) of the through-hole conductor 3, and the surface (4*c*) of the resin 4 in the hollow space 30 are formed substantially flush with each other. Therefore, the metal film (10*b*) also is formed with good flatness, parallel to the surface of the insulating layer 2, and with a uniform thickness.

Figure 3L:
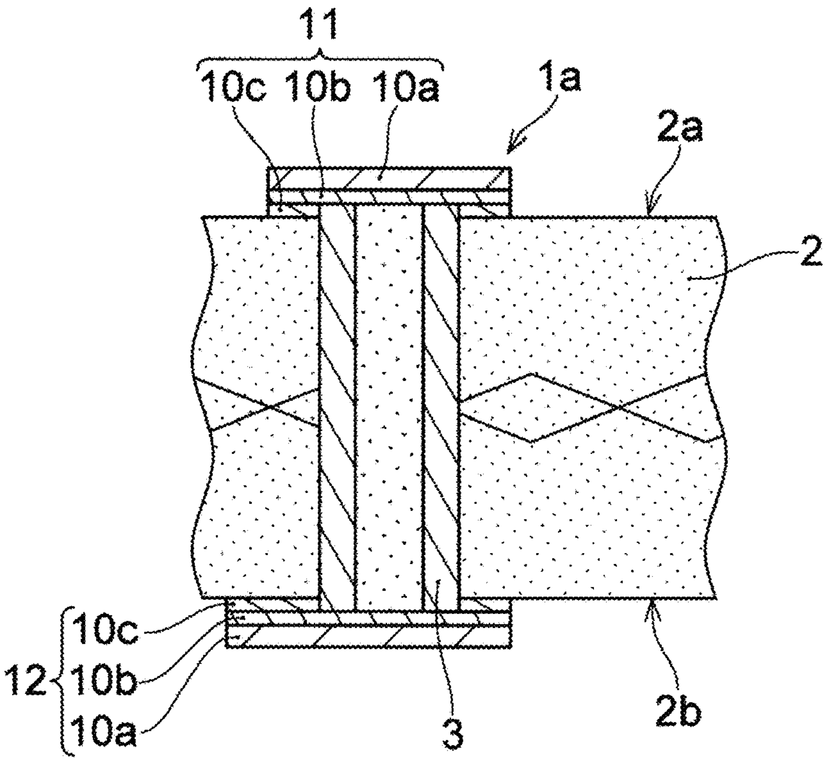
FIG. 3L is a cross-sectional view illustrating a portion of an example of a wiring substrate being manufactured using a manufacturing method according to an embodiment of the present invention.
Figure 3M:
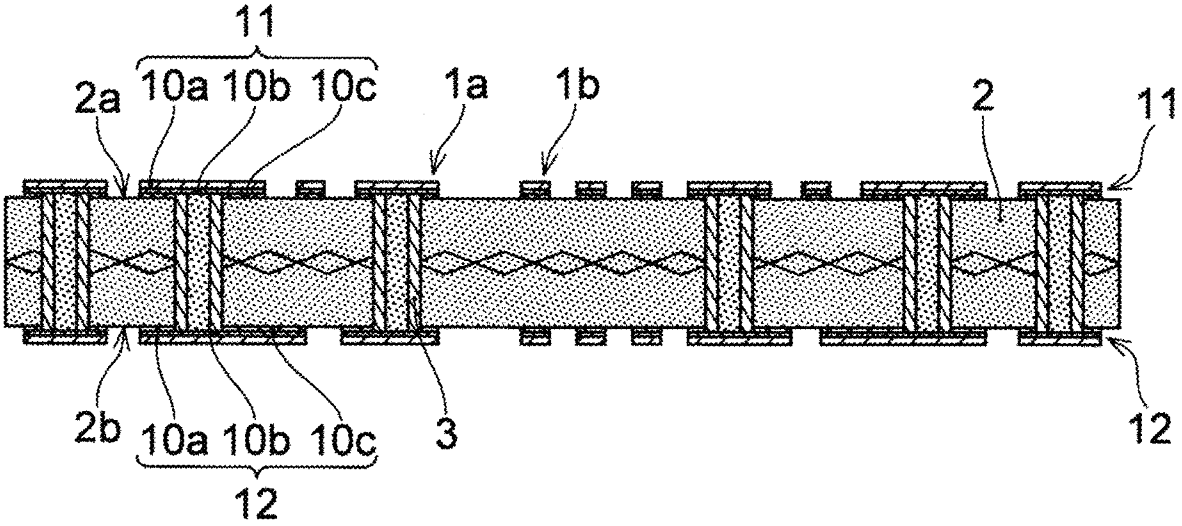
FIG. 3M is a cross-sectional view illustrating an example of a wiring substrate being manufactured using a manufacturing method according to an embodiment of the present invention.
Figure 3N:
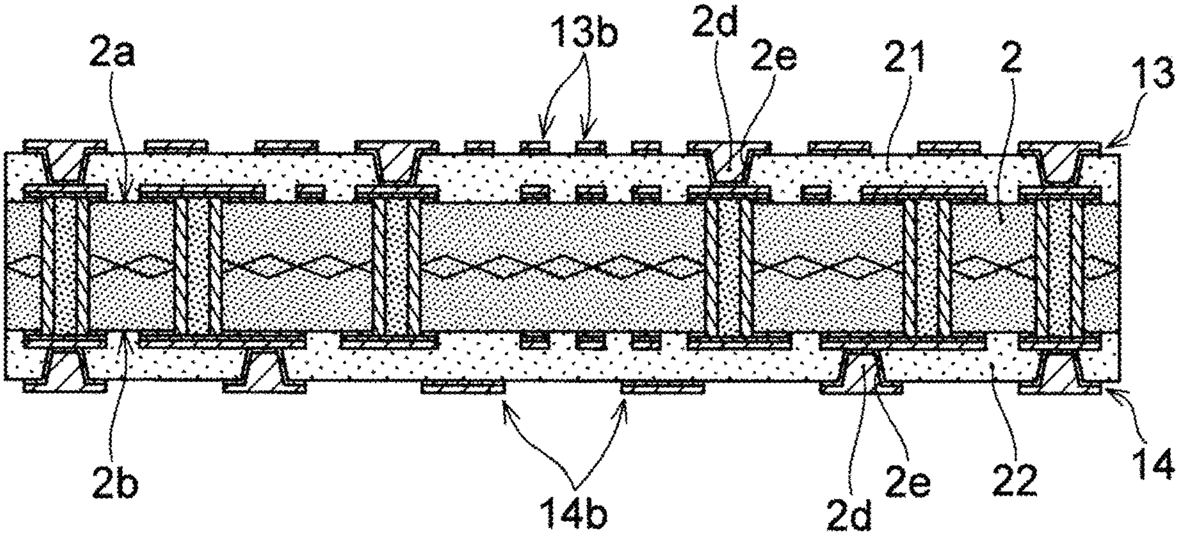
FIG. 3N is a cross-sectional view illustrating an example of a wiring substrate being manufactured using a manufacturing method according to an embodiment of the present invention.

As illustrated in FIGS. 3L and 3M, conductor layers (a conductor layer 11 and a conductor layer 12), which each include the metal foil (10*c*), the metal film (10*b*) (second plating film) and a metal film (10*a*) and each have predetermined patterns, are respectively formed on the surfaces on the first surface (2*a*) side and the second surface (2*b*) side of the insulating layer 2. FIG. 3M illustrates the entire wiring substrate in a process of being manufactured after the formation of the conductor layer 11 and the conductor layer 12. For example, the metal film (10*a*) is formed by electrolytic plating using the metal film (10*b*) as a power feeding layer. As a result, the conductor layer 11 and the conductor layer 12 each having a three-layer structure are formed. After that, a core substrate 1 having predetermined conductor patterns is obtained by patterning the conductor layer 11 and the conductor layer 12 using a subtractive method. Since the metal film (10*b*) is formed with good flatness, the metal film (10*a*) on the metal film (10*b*) is also flatly and stably formed. A conductor pad (1*a*) with excellent flatness is formed on the through-hole conductor 3.

It is also possible that the conductor layer 11 and the conductor layer 12 are formed using a semi-additive method. In this case, a plating resist (not illustrated in the drawings) having openings at predetermined locations is formed on the metal film (10*b*), and an electrolytic plating film (the metal film (10*a*)) is formed in the openings. The conductor layer 11 and the conductor layer 12 each including the metal film (10*a*) are formed. After that, the plating resist is removed, and unwanted portions of the metal foil (10*c*) and the metal film (10*b*) are removed by etching.

When the conductor layer 11 and the conductor layer 12 are formed to include fine wiring patterns, before forming the metal film (10*b*) in the process illustrated in FIG. 3K, a thickness of the metal foil (10*c*) may be reduced by polishing, half-etching, or the like. It is possible to shorten a processing time for removing unwanted portions of the metal foil (10*c*) and the metal film (10*b*) by etching in order to separate the conductor patterns in each of the conductor layers. It may be possible that excessive etching in width directions of the wiring patterns is suppressed and wiring patterns with fine widths are obtained.

It is also possible that each of the conductor layer 11 and the conductor layer 12 does not have a three-layer structure. For example, conductor patterns may be formed by forming a thick metal film (10*b*) and etching unwanted portions, without forming the metal film (10*a*).

When the wiring substrate 100 of FIG. 1 is manufactured, as illustrated in FIG. 3N, an insulating layer 21 and a conductor layer 13 are formed on the first surface (2*a*) side of the insulating layer 2, and an insulating layer 22 and a conductor layer 14 are formed on the second surface (2*b*) side of the insulating layer 2. In the formation of the insulating layer 21 and the insulating layer 22, on the first surface (2*a*) of the insulating layer 2 and on the conductor layer 11, and on the second surface (2*b*) of the insulating layer 2 and on the conductor layer 12, for example, a film-like epoxy resin is laminated and is heated and pressed. As a result, the insulating layer 21 and the insulating layer 22 are formed. Through holes (2*e*) for forming the via conductors (2*d*) are formed in the insulating layers by, for example, $CO_2$ laser irradiation or the like.

Each of the conductor layer 13 and the conductor layer 14 is formed using, for example, a semi-additive method. That is, a metal film is formed on the surfaces of the insulating layer 21 and the insulating layer 22 and in the through holes (2*e*) by electroless plating or sputtering. A plating film is formed by pattern plating including electrolytic plating using the metal film as a power feeding layer. After that, unwanted portions of the metal film are removed, for example, by etching or the like. As a result, a conductor layer 13 including predetermined conductor patterns such as wiring patterns (13*b*), and a conductor layer 14 including predetermined conductor patterns such as wiring patterns (14*b*) are formed. The via conductors (2*d*) are formed in the through holes (2*e*).

After that, using the same method as that described with reference to FIG. 3N, a pair of an insulating layer 21 and a conductor layer 13 are further formed on the first surface (2*a*) side of the insulating layer 2, and a pair of an insulating layer 22 and a conductor layer 14 are further formed on the second surface (2*b*) side of the insulating layer 2. A solder resist 5 is formed on the outer conductor layer 13 and insulating layer 21 of the two pairs of conductor layers 13 and insulating layers 21. A solder resist 5 is formed on the outer conductor layer 14 and insulating layer 22 of the two pairs of conductor layers 14 and insulating layers 22. Each of the solder resists 5 is formed by applying, spraying, or laminating in a form of a film, a photosensitive epoxy resin or polyimide resin. Then, openings that each expose a portion of the conductor layer 13 or a portion of the conductor layer 14 are formed in the solder resists 5 by, for example, exposure and development, or laser processing, or the like. Through the above processes, the wiring substrate 100 in the example of FIG. 1 is completed.

A method for manufacturing a wiring substrate according to an embodiment of the present invention is not limited the method described with reference to the drawings. In the method for manufacturing a wiring substrate of the embodiment, it is also possible that any process other than the processes described above is added, or some of the processes described above are omitted.

Japanese Patent Application Laid-Open Publication No. 2001-298257 describes a method for manufacturing a printed wiring board in which a hole-filling paste is filled and cured in through holes of a substrate having the through holes. A high-viscosity hole-filling paste is press-fitted and filled into the through holes using a roller squeegee, and is cured after the filling is completed.

In filling the through holes with the high-viscosity filling paste described in Japanese Patent Application Laid-Open Publication No. 2001-298257, recesses may occur on surfaces of the through holes after curing. Flatness of a built-up layer near the through holes may be impaired, and a problem such as a connection failure in a circuit may occur.

A method for manufacturing a wiring substrate according to an embodiment of the present invention includes: preparing a substrate that includes an insulating layer and a metal foil laminated on both sides of the insulating layer; forming a through hole that penetrates the insulating layer and the metal foil; forming a first plating film on an entire surface of the metal foil and on an inner wall of the through hole; laminating a resin sheet on the first plating film; filling a resin exuded from the resin sheet into inside of the through hole surrounded by the first plating film by pressing the resin sheet; removing the resin sheet; and forming, on each of the both sides of the insulating layer, a second plating film that covers a surface of the resin filled in the inside of the through hole.

According to an embodiment of the present invention, it is thought that a method for manufacturing a wiring substrate is provided that allows a wiring substrate to be properly manufactured in which flatness of a through-hole surface and a built-up layer near a through hole is maintained.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for manufacturing a wiring substrate, comprising:

preparing a substrate comprising an insulating layer and a plurality of metal foils laminated on a plurality of sides of the insulating layer, respectively;

forming a through hole in the substrate such that the through hole penetrates through the insulating layer and the metal foils of the substrate;

forming a first plating film on the substrate such that the first plating film is formed on an entire surface of each of the metal foils and an inner wall of the through hole;

laminating at least one resin sheet on the first plating film such that the at least one resin sheet covers the first plating film formed on the entire surface of a respective one of the metal foils;

pressing the at least one resin sheet such that resin is extruded from the at least one resin sheet into the through hole and fills a space surrounded by the first plating film inside the through hole in the substrate;

removing the at least one resin sheet from the first plating film formed on the entire surface of the respective one of the metal foils except the resin extruded from the at least one resin sheet into the through hole; and forming a second plating film on the substrate such that the second plating film covers a surface of the resin in the through hole, wherein the pressing of the at least one resin sheet includes applying a vacuum press to the at least one resin sheet.

2. The method for manufacturing a wiring substrate according to claim 1, further comprising:

applying a release film on the insulating layer before the laminating of the at least one resin sheet such that the release film covers the first plating film formed on the respective one of the metal foils; and forming an opening in the release film such that the opening exposes the through hole before the laminating of the at least one resin sheet.

3. The method for manufacturing a wiring substrate according to claim 2, wherein the removing of the resin sheet includes forming an opening in the at least one resin sheet such that the opening in the at least one resin sheet exposes an inner wall of the opening formed in the release film, and peeling the release film from the first plating film.

4. The method for manufacturing a wiring substrate according to claim 3, wherein the forming of the opening in the at least one resin sheet includes applying laser processing upon the at least one resin sheet such that the opening is formed in the at least one resin sheet.

5. The method for manufacturing a wiring substrate according to claim 4, wherein the forming of the opening in the at least one resin sheet includes applying the laser processing upon the at least one resin sheet such that a portion of the resin is removed and that a surface of the resin in the through hole is recessed from an upper surface of the first plating film.

6. The method for manufacturing a wiring substrate according to claim 3, further comprising:

removing the first plating film exposed by the removing of the at least one resin sheet such that a surface of the resin in the through hole is aligned with a surface of the respective one of the metal foils.

7. The method for manufacturing a wiring substrate according to claim 6, further comprising:

forming a conductive circuit comprising the respective one of the metal foils and the second plating film on the insulating layer.

8. The method for manufacturing a wiring substrate according to claim 6, wherein the forming of the opening in the at least one resin sheet includes applying laser processing upon the at least one resin sheet such that the opening is formed in the at least one resin sheet.

9. The method for manufacturing a wiring substrate according to claim 8, wherein the forming of the opening in the at least one resin sheet includes applying the laser processing upon the at least one resin sheet such that a portion of the resin is removed and that the surface of the resin in the through hole is recessed from an upper surface of the first plating film.

10. The method for manufacturing a wiring substrate according to claim 2, wherein the forming of the opening in the release film includes applying laser processing upon the release film such that the opening is formed in the release film.

11. The method for manufacturing a wiring substrate according to claim 2, further comprising:

removing the first plating film exposed by the removing of the at least one resin sheet such that a surface of the resin in the through hole is aligned with a surface of the respective one of the metal foils.

12. The method for manufacturing a wiring substrate according to claim 11, further comprising:

forming a conductive circuit comprising the respective one of the metal foils and the second plating film on the insulating layer.

13. The method for manufacturing a wiring substrate according to claim 11, wherein the removing of the first plating film includes etching the first plating film.

14. The method for manufacturing a wiring substrate according to claim 11, further comprising:

polishing the surface of the respective one of the metal foils and the surface of the resin in the through hole after the removing of the first plating film.

15. The method for manufacturing a wiring substrate according to claim 11, wherein the forming of the opening in the release film includes applying laser processing upon the release film such that the opening is formed in the release film.

16. The method for manufacturing a wiring substrate according to claim 1, further comprising:

removing the first plating film exposed by the removing of the at least one resin sheet such that a surface of the resin in the through hole is aligned with a surface of the respective one of the metal foils.

17. The method for manufacturing a wiring substrate according to claim 16, further comprising:

forming a conductive circuit comprising the respective one of the metal foils and the second plating film on the insulating layer.

18. The method for manufacturing a wiring substrate according to claim 16, wherein the removing of the first plating film includes etching the first plating film.

19. The method for manufacturing a wiring substrate according to claim 16, further comprising:

polishing the surface of the respective one of the metal foils and the surface of the resin in the through hole after the removing of the first plating film.

20. The method for manufacturing a wiring substrate according to claim 1, wherein the laminating of the at least one resin sheet on the first plating film includes laminating a plurality of resin sheets on the plurality of sides of the insulating layer, respectively.

* * * * *